(12) United States Patent
van den Berg et al.

(10) Patent No.: US 6,835,039 B2
(45) Date of Patent: Dec. 28, 2004

(54) METHOD AND APPARATUS FOR BATCH PROCESSING OF WAFERS IN A FURNACE

(75) Inventors: Jannes Remco van den Berg, Emmeloord (NL); Edwin den Hartog, Utrecht (NL)

(73) Assignee: ASM International N.V., Bilthoven (NL)

( * ) Notice: Subject to any disclaimer, the term of this patent is extended or adjusted under 35 U.S.C. 154(b) by 0 days.

(21) Appl. No.: 10/390,574

(22) Filed: Mar. 13, 2003

(65) Prior Publication Data

US 2003/0180125 A1 Sep. 25, 2003

Related U.S. Application Data

(60) Provisional application No. 60/379,885, filed on May 10, 2002, and provisional application No. 60/365,122, filed on Mar. 15, 2002.

(51) Int. Cl.[7] .................................................. B65H 1/00
(52) U.S. Cl. ........................ 414/217; 414/411; 414/936
(58) Field of Search ................................ 414/217, 936, 414/935, 939, 411, 222.02

(56) References Cited

U.S. PATENT DOCUMENTS

| | | | |
|---|---|---|---|
| 4,407,654 A | 10/1983 | Irwin | |
| 4,468,259 A | 8/1984 | Mimura | |
| 4,770,590 A | 9/1988 | Hugues et al. | |
| 5,028,195 A | * 7/1991 | Ishii et al. | 414/783 |
| 5,110,248 A | * 5/1992 | Asano et al. | 414/172 |
| 5,162,047 A | 11/1992 | Wada et al. | |
| 5,178,639 A | * 1/1993 | Nishi | 414/172 |
| 5,192,371 A | 3/1993 | Shuto et al. | |
| 5,219,079 A | 6/1993 | Nakamura | |
| 5,310,339 A | 5/1994 | Ushikawa | |
| 5,316,472 A | 5/1994 | Niino et al. | |
| 5,334,257 A | 8/1994 | Nishi et al. | |
| 5,407,449 A | 4/1995 | Zinger | |
| 5,482,558 A | 1/1996 | Watanabe et al. | |
| 5,482,559 A | 1/1996 | Imai et al. | |
| 5,492,229 A | 2/1996 | Tanaka et al. | |
| 5,556,147 A | 9/1996 | Somekh et al. | |
| 5,556,275 A | 9/1996 | Sakata et al. | |
| 5,820,367 A | 10/1998 | Osawa | |
| 5,858,103 A | 1/1999 | Nakajima et al. | |
| 5,865,321 A | 2/1999 | Tomanovich | |
| 5,879,459 A | 3/1999 | Gadgil et al. | |

(List continued on next page.)

FOREIGN PATENT DOCUMENTS

| | | |
|---|---|---|
| EP | 86308980.1 | 11/1986 |
| EP | 0 405 301 | 1/1991 |
| EP | 0 821 403 | 1/1998 |
| GB | 2 199 022 | 6/1988 |
| JP | 61247678 | 10/1986 |
| JP | 02002033284 A | 1/2002 |
| WO | WO 00/68977 | 5/2000 |

*Primary Examiner*—James R. Bidwell
(74) *Attorney, Agent, or Firm*—Knobbe, Martens, Olson & Bear, LLP

(57) ABSTRACT

A method and apparatus for batch processing of semiconductor wafers in a furnace advantageously allow for wafers to be supported for processing at very high temperatures (e.g., about 1350° C.). Each wafer is supported during processing by a wafer support with full perimeter support, such as a ring or plate. The wafers, on their supports, are removable and vertically spaced apart in a wafer support holder. A transfer station is provided wherein, during loading, a wafer is placed on a wafer support and, during unloading, the wafer is separated from the wafer support. A FOUP (Front Opening Unified Pod) is adapted to accommodate a plurality of wafer supports and to accommodate the transfer station. The wafer support, with a wafer supported on it, is transferred from the transfer station to a wafer support holder for processing.

56 Claims, 14 Drawing Sheets

U.S. PATENT DOCUMENTS

| | | | |
|---|---|---|---|
| 5,897,311 A | 4/1999 | Nishi | |
| 5,931,666 A | 8/1999 | Hengst | |
| 5,981,966 A * | 11/1999 | Honma | 414/172 |
| 5,983,906 A | 11/1999 | Zhao et al. | |
| 6,099,302 A | 8/2000 | Hong et al. | |
| 6,111,225 A | 8/2000 | Ohkase et al. | |
| 6,168,668 B1 | 1/2001 | Yudovsky | |
| 6,203,617 B1 | 3/2001 | Tanoue et al. | |
| 6,280,183 B1 | 8/2001 | Mayur et al. | |
| 6,287,112 B1 | 9/2001 | Van Voorst Vader et al. | |
| 6,321,680 B2 | 11/2001 | Cook et al. | |
| 6,341,935 B1 | 1/2002 | Tseng | |
| 6,347,919 B1 | 2/2002 | Ryan et al. | |
| 6,361,313 B1 | 3/2002 | Beyaert et al. | |
| 6,375,403 B1 * | 4/2002 | Mages et al. | 414/939 |
| 6,390,753 B1 | 5/2002 | De Ridder | |
| 6,399,922 B2 | 6/2002 | Okase et al. | |
| 6,464,445 B2 | 10/2002 | Knapik et al. | |
| 6,559,039 B2 | 5/2003 | Wang et al. | |
| 2002/0182892 A1 | 12/2002 | Arai et al. | |

* cited by examiner

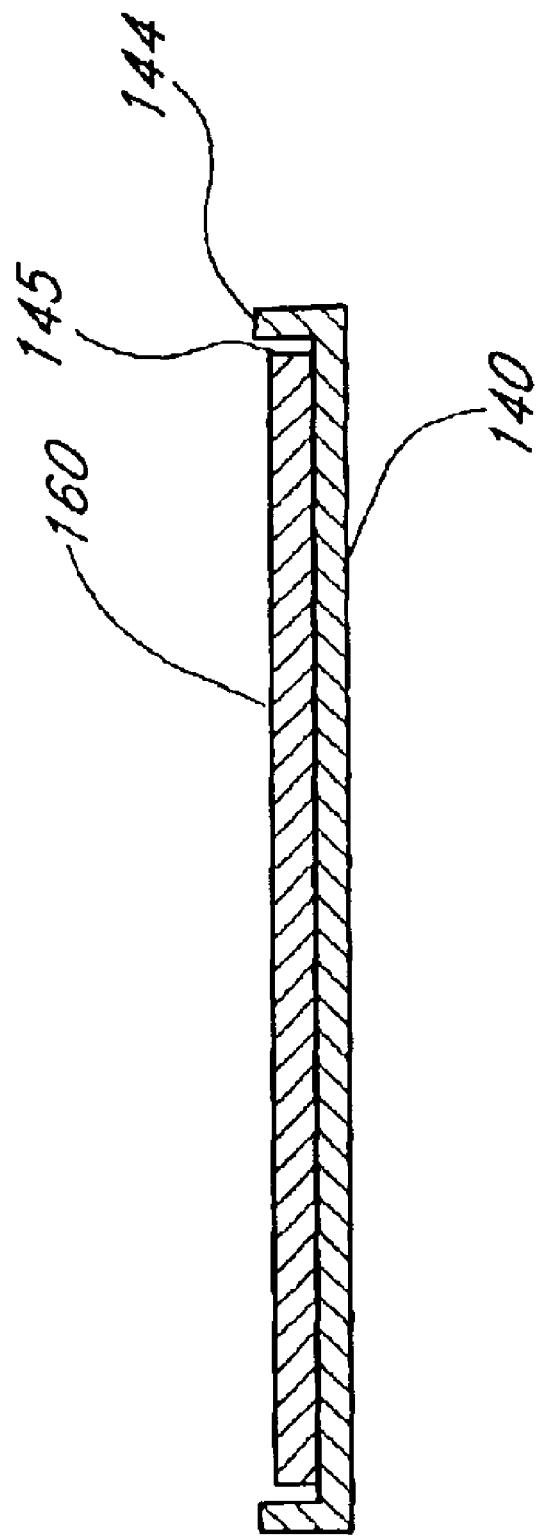

23 WAFER SUPPORT ACCOMMODATIONS
AND TRANSFER STATION

20 WAFER SUPPORT ACCOMMODATIONS
AND TRANSFER STATION

23 WAFER SUPPORT ACCOMMODATIONS

TRANSFER STATION

METHOD AND APPARATUS FOR BATCH PROCESSING OF WAFERS IN A FURNACE

REFERENCE TO RELATED APPLICATION

This application claims the priority benefit of U.S. Provisional Application Ser. No. 60/365,122, filed Mar. 15, 2002, and U.S. Provisional Application Ser. No. 60/379,885, filed May 10, 2002.

FIELD OF THE INVENTION

This invention relates generally to semiconductor fabrication and, more particularly, to a method and apparatus for transferring and supporting wafers for batch processing in a furnace.

BACKGROUND OF THE INVENTION

Heat-related complications can preclude the use of common wafer boats for very high temperature treatment or processing of a batch of wafers in a furnace, e.g., processing at temperatures up to about 1350° C. For example, common wafer boats may support wafers only at their edges. With such a support scheme, because the mechanical strength of a wafer can be reduced at very high temperatures, the wafer's own weight can cause it to plastically deform at very high temperatures.

Other available wafer boat wafer supports are described in U.S. Pat. Nos. 5,865,321 and 5,820,367. U.S. Pat. No. 5,865,321 describes a wafer boat having a wafer support with multiple inwardly extending arms to support the wafer at more inward locations. U.S. Pat. No. 5,820,367 describes a wafer boat that supports a wafer at a central location using the entire circumference of a ring support. The supports in these wafer boats, however, are still not sufficiently supportive to prevent plastic deformation and consequent crystallographic slip of the wafer. In order to prevent slip, wafers should be supported over a substantial portion of their bottom surface areas.

Wafer supports meeting this criteria are known for single wafer systems. For such systems, susceptors supporting wafers over their entire bottom surface area and support rings forming a complete circle to support a wafer at its perimeter are known in the prior art. Special measures, however, are required to place a wafer onto or to separate a wafer from such susceptors.

In particular, with such a single wafer system, when using a robot end effector according to the prior art, access to the wafer is generally provided from the bottom and the susceptor stays in place within a process chamber while wafers are serially loaded and unloaded. Typically, the robot end effector places a wafer on moveable pins at a level above the susceptor, the wafer being spaced sufficiently above the susceptor to allow enough clearance for retracting the robot end effector without the robot end effector touching the wafer or the susceptor. After retraction, the pins move downward to lower the wafer onto the susceptor. To unload the wafer, the reverse of these steps occurs. While suitable for single wafer processing, such a wafer loading and support system is not easily applicable to a batch processing system because, if possible at all, such a system would be unacceptably complicated and cumbersome, since it would require, inter alia, that every processing position be provided with moveable pins and the attendant hardware and control systems to move these pins.

Accordingly, it is an object of the present invention to provide a wafer boat with a wafer support system that, inter alia, provides support for wafers over a substantial portion of their bottom surface areas and that allows for efficient loading and unloading of the wafers for processing in a process chamber.

SUMMARY OF THE INVENTION

In accordance with one preferred embodiment of the invention, a method for semiconductor processing is provided. The method includes loading a wafer onto a wafer support in a transfer station, transporting the wafer into a process chamber from the transfer station and subjecting the wafer to a semiconductor fabrication process in the process chamber. During both transporting the wafer into the process chamber and subjecting the wafer to a semiconductor fabrication process, the wafer is seated upon the wafer support.

In accordance with another preferred embodiment, a method for handling a wafer and a wafer support for processing is provided. The method includes placing a wafer on a wafer support, subsequently transporting the wafer while seated upon the wafer support into a wafer boat, and subjecting the wafer to a semiconductor fabrication process while the wafer is seated upon the wafer support in the wafer boat.

In accordance with yet another preferred embodiment, a system for processing a substrate is provided. The system includes a plurality of substrate supports for supporting a plurality of substrates. The substrate supports support an entire perimeter of a substrate and are held in a substrate support holder, from which they can also be removed. A process chamber accommodates the substrate support holder during substrate processing. The system also comprises a substrate loading station that is configured to load a substrate onto a substrate support, where the substrate loading station is separate from the substrate support holder.

In accordance with another preferred embodiment, a semiconductor wafer cassette is provided. The cassette houses a wafer loading station that is configured for loading a wafer onto a wafer support.

BRIEF DESCRIPTION OF THE FIGURES

The invention will be better understood from the detailed description of the preferred embodiments and from the appended drawings, which are meant to illustrate and not to limit the invention, and wherein:

FIG. 9B is a cross-sectional view of the wafer and wafer support of FIG. 9A;

DETAILED DESCRIPTION OF THE PREFERRED EMBODIMENTS

According to preferred embodiments of the invention, wafer supports are provided for supporting a wafer during a semiconductor fabrication process. The wafer supports can be removably stored in the storage accommodations of a wafer support holder. The wafer support holder is similar to a standard wafer boat used for semiconductor processing and holds the wafers and wafer supports during processing in a furnace. The wafer supports can also be removably stored in the storage accommodations of a wafer processing cassette, such as a front opening unified pod (FOUP), that has been adapted to accommodate the wafer supports that are of slightly different dimensions than the wafers. The wafer supports preferably support a wafer, over an entire perimeter of a wafer, in which case the wafer supports desirably have increased hoop strength in comparison to supports which do not extend around the entire perimeter of the wafer. More preferably, the wafer supports support a substantial portion of a wafer. In one embodiment, the support can comprise a plate of material, which can support the entire bottom surface of a wafer. In other embodiments, the wafer support can be in the shape of a ring. In supporting a "substantial portion" of a wafer, the wafer support extends under the wafer to cover greater than about 10%, preferably greater than about 50% and more preferably greater than about 90% of the bottom surface of the wafer.

In addition to wafer supports, according to preferred embodiments of the invention, a transfer or loading station is also provided for placing a wafer on a wafer support and for removing a wafer from a wafer support. The transfer station comprises an accommodation for a wafer support at a first level and an accommodation for a wafer at a second level, the second level being above the first level. During loading, the wafer and wafer support, initially at the second and first levels, respectively, are made to contact. In contacting, the wafer is seated upon the wafer support. During unloading, the wafer and wafer support, initially at the same level, are made to separate, coming to rest at the second and first levels, respectively.

Figure 1:
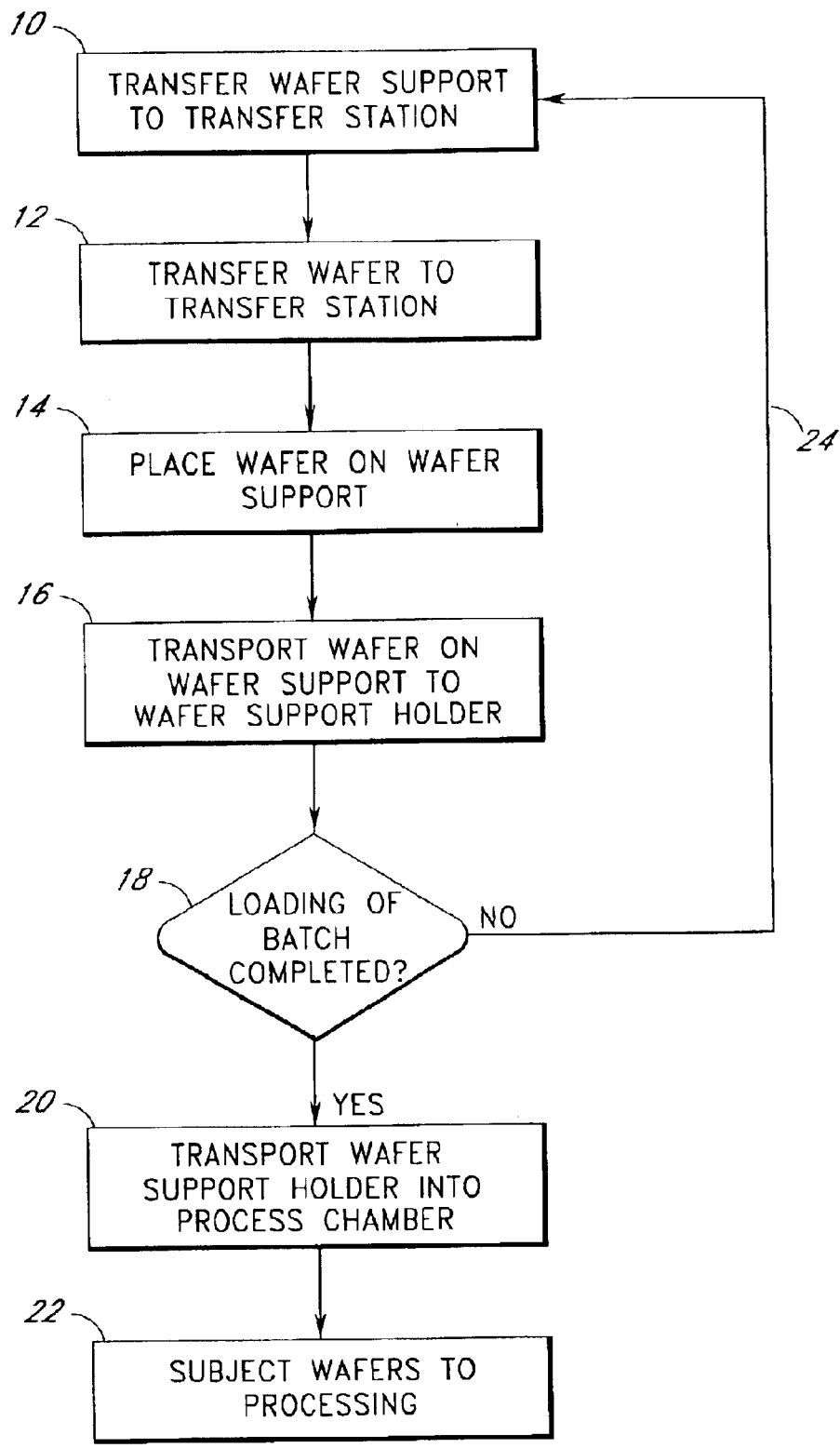
FIG. 1 is a flow diagram illustrating processing of a batch of wafers in accordance with preferred embodiments of the invention.

A flow diagram of an exemplary procedure for loading and processing a batch of wafers in accordance with preferred embodiments of the invention is given schematically in FIG. 1. As indicated by 10, a wafer support is transported to a transfer station from a wafer support storage position. This transfer can be performed using a robot end effector designed for wafer transport. The robot end effector contacts the wafer support from the bottom and transports the wafer support to the transfer station. At the transfer station, the robot places the wafer support at a first level.

As indicated by 12, a wafer is also transported to the transfer station. The wafer occupies a second level in the transfer station, above the first level.

While still in the transfer station, the wafer is then seated upon the wafer support, as indicated by 14. Then the wafer, together with the wafer support upon which it is seated, is transported to the wafer support holder or "boat" as indicated by 16.

In the step indicated by 18, the system checks if loading of the batch of wafers has been completed. It will be appreciated that the system includes a processor and memory programmed to conduct the indicated steps by controlling the robot and other system mechanisms. If loading has not been completed, the previous sequence is repeated, as indicated by loop 24. The wafers are preferably loaded into the wafer support holder sequentially, such as from the topmost slot down to the bottommost slot. When loading is completed, e.g., preferably, when a full batch of wafers, supported on wafer supports, has been loaded into the wafer support holder, the wafer support holder is loaded into a process chamber, such as a furnace, as indicated by 20. Alternatively, loading the wafer/support combinations can be conducted through a door while the wafer support holder is positioned within the process chamber.

In the process chamber the wafers are subjected to processing as indicated by 22. Advantageously, processing can be performed at very high temperatures, preferably greater than about 1000° C., more preferably greater than about 1200° C. and most preferably greater than about 1300° C. After processing, the wafers are unloaded (not shown) in reverse order.

Preferably, transfer of the wafer supports and of the wafers into and out of the transfer station is performed using the same robot and the same end effector. It will be appreciated, however, that different robots and/or different end effectors can be used in other arrangements to move the wafer supports and wafers. In particular, depending upon the wafer support used, the robot end effector can be an edge support end effector, contacting both the wafer support and the wafer at its edges, or it can be a more conventional end effector, contacting both the wafer support and the wafer towards the center of its bottom surface, or it can be a combination of these two end effectors, e.g. an end effector that contacts the wafer support at its edges and contacts the wafer towards the center of its bottom surface. More generally, the end effector can be any end effector suitable for holding the wafer support and the wafer and for performing the actions described herein. For example, edge support end effectors are particularly suitable for ring shaped wafer supports, while wafer supports which are plates may be held with end effectors contacting the wafer supports at the edges or more central regions on the bottom surface of the wafer supports. Exemplary end effectors are disclosed in U.S. Provisional Application No. 60/377,904, filed May 2, 2002, and corresponding U.S. application Ser. No. 10/361, 480 entitled TWO LEVEL END EFFECTOR, filed Feb. 5, 2003 by den Hartog, the disclosures of which are incorporated herein by reference.

The wafer supports supporting the wafer preferably comprise a circular plate, i.e., a structure that supports the entire bottom surface area of a wafer seated upon it (see FIGS. 5A and 6A and corresponding text below). The wafer support can also be in the shape of a ring, i.e. a structure with a vacant center (see FIGS. 5B and 6B and corresponding text below). It will be appreciated that while the support "ring" can have a circular shape, the support "ring" need not be round, it may be, e.g. in a hexagonal, or even square, shape so long as associated apparatus are configured to accept that shape.

In one embodiment, the wafer supports can permanently reside in the processing system. For example, they can be stored in the wafer support holder before and after processing. In another embodiment, the wafer supports are stored in and supplied to a processing system in a cassette, and more particularly in a FOUP adapted to accommodate the wafer supports. This adaptation requires only that the support frame for holding the wafer supports inside the FOUP be changed from the FOUP's standard construction. As such, the outer surfaces of the FOUP can retain their standard construction. Preferably, the wafer supports are configured to support a 300 mm wafer and, so, have a diameter that is slightly larger than the diameter of a 300 mm wafer.

In addition, in a preferred embodiment the transfer station is provided as part of the FOUP holding the wafer supports. These adapted FOUPs can interface with the processing system via commercially available FOUP-receiving stations, which comprise a FOUP door opener. As such, this embodiment is particularly well adapted for retrofitting existing systems. Moreover, the transfer station can be located at any point between the upper and lower ends of the FOUP, or at either of the upper or lower ends. Preferably, the transfer station is located at the lower end of the FOUP.

The wafers are preferably also supplied to a processing system in cassettes. For wafers with a diameter of 300 mm, a standard FOUP preferably serves as the cassette used to provide wafers to the processing system. The FOUP interfaces with a FOUP station, comprising a FOUP door opener, provided in the processing system. As such, in another embodiment, just as a FOUP storing wafer supports may contain a transfer station, the FOUP storing wafers may also contain a transfer station. Advantageously, when used in a processing system in which wafer supports permanently reside in the processing system, such a FOUP precludes the need for the processing system to be significantly retrofitted with, e.g., a separate transfer station. It will be appreciated that in yet other embodiments, the transfer station can exist in a structure independent of either the FOUPs storing the wafers or the wafer supports.

Inside the transfer station, wafer and wafer support accommodations in the transfer station can comprise various types of support structures used for loading and unloading wafers onto wafer supports. As such, placing a wafer on a wafer support can be done in several ways. For example, in one embodiment, the support structures for the wafer support can be moveable in a vertical direction while the wafer remains stationary. In another embodiment, the support structures for the wafer can be moveable in a vertical direction while the wafer support remains stationary. In yet another embodiment, both the support structures for the wafer and the support structure for the wafer support are moveable. For example, after placing a wafer support and a wafer in the storage accommodations, the support structures for the wafer can move such that the wafer is moved towards the wafer support (or vice versa or both the wafer and the wafer support can move) until the wafer rests on the wafer support. A wafer support is preferably provided with cutaways (e.g., through holes) to allow for vertical movement of those support structures and of the wafer independent of the wafer support itself.

In another particularly simple embodiment, all the support structures in the transfer station are stationary. Vertical movement to place the wafer on the wafer support is carried out by a robot that transports the wafer support upwardly to contact the wafer. Accordingly, the preferred embodiments advantageously allow wafers to be provided to a process chamber on wafer supports that support a substantial portion of a wafer's bottom surface area, including the entire perimeter of a wafer.

Reference will now be made to the Figures, wherein like numerals refer to like parts throughout.

Figure 2:
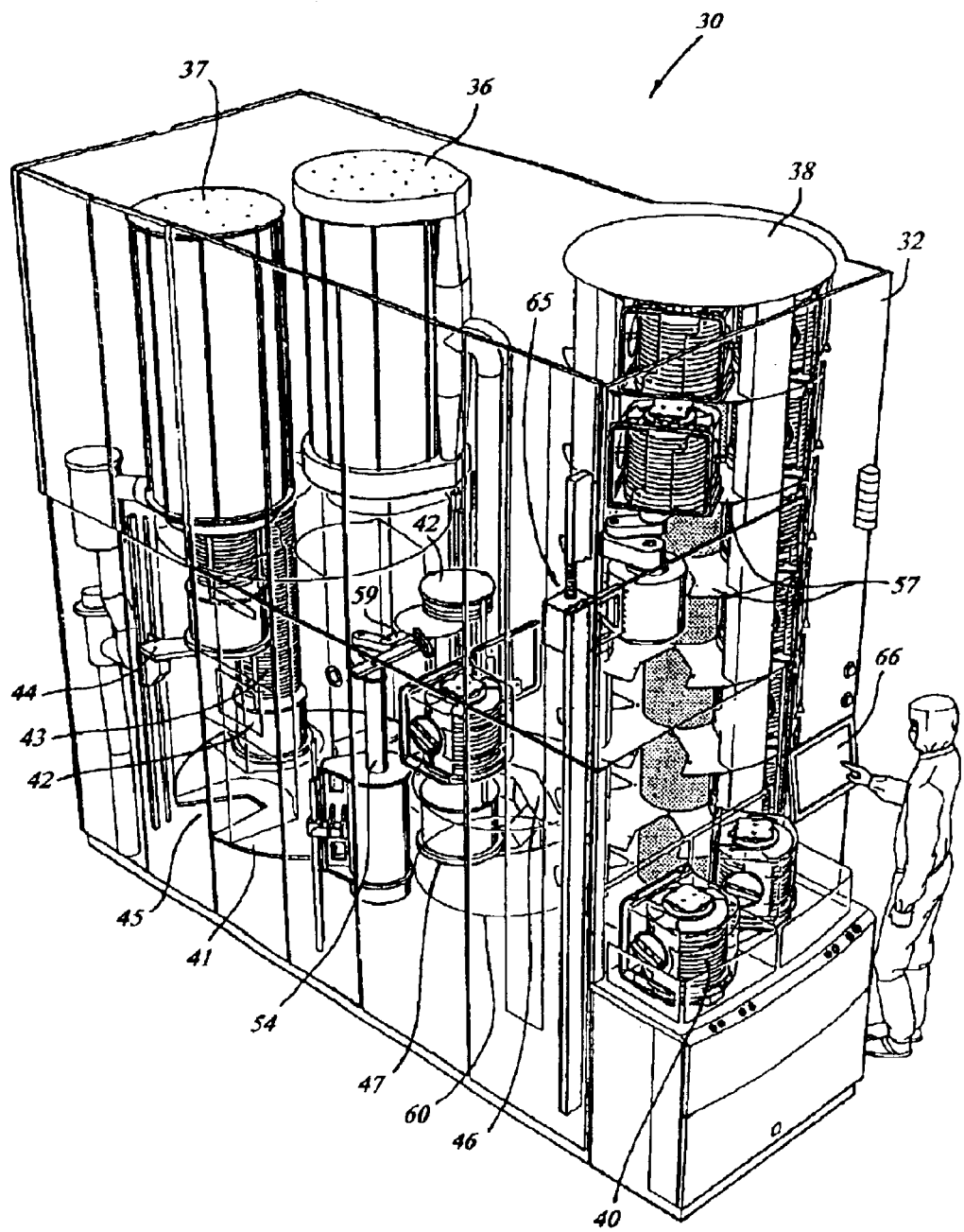
FIG. 2 is a perspective view of an exemplary wafer processing system for use with preferred embodiments of the invention.
Figure 3:
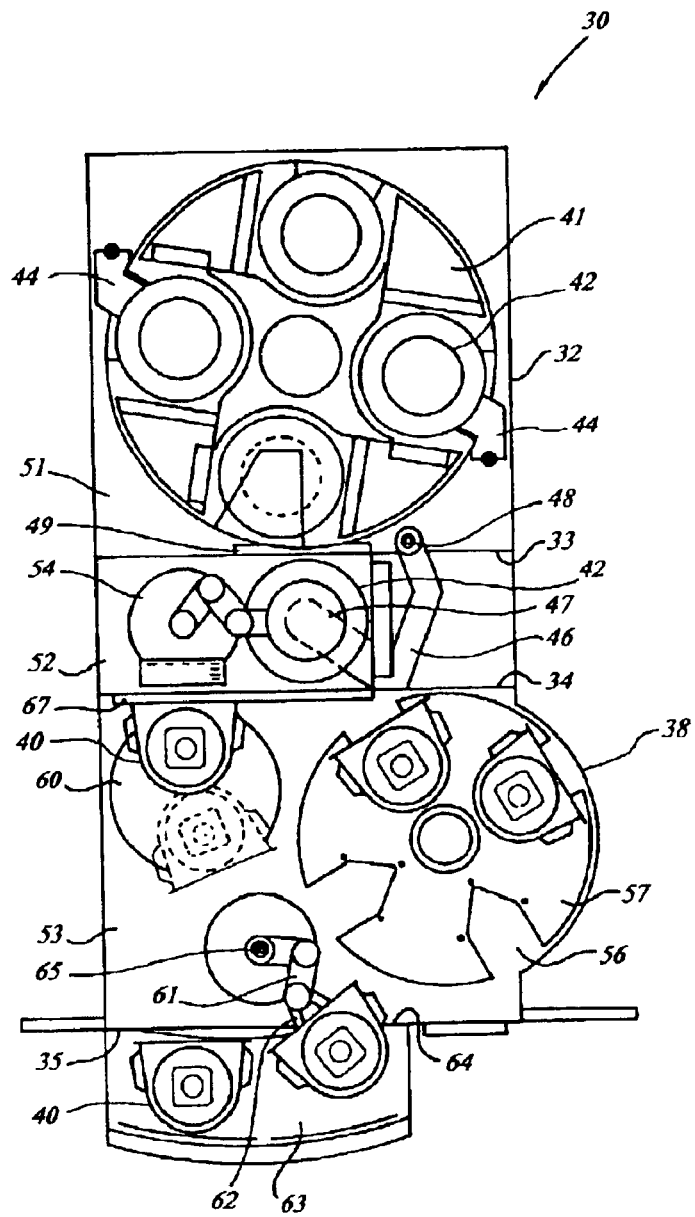
FIG. 3 is a schematic plan view of the system of FIG. 2.

With reference to FIGS. 2 and 3, an exemplary wafer processing system containing a process chamber is illustrated and indicated generally by the reference numeral 30. The exemplary system 30 of FIGS. 2 and 3 comprises a housing 32 and is generally installed in a so-called "clean room." In addition to the housing 32, partitions 33, 34 and 35 (omitted from FIG. 2 for clarity of illustration) are also present. The housing 32 delimits, with the partition 33, a processing chamber 51. The processing area 51 comprises reactors, which in this example, are vertical furnaces 36, 37. The housing 32 and the partitions 33 and 34 define a wafer handling section or chamber 52. A cassette transfer section or chamber 53 is defined between the housing 32 and partitions 34 and 35. An input/output station, to transfer cassettes into and out of the system 30, is indicated by reference numeral 63.

Wafers are supplied in cassettes 40, which are placed on the input/output station 63. A FOUP according the preferred embodiments preferably serves as the cassette 40. A cassette handling device 61 transfers the cassettes 40 from the input/output station 63 through a closable opening 64 into a cassette store 38 located in the cassette transfer section 53. The cassette store 38 is provided with a number of vertically aligned rotary platforms 57 on which the cassettes 40 are stored. The cassette handling device 61 is movable in a vertical direction by means of an elevator 65 so that the different platforms 57 can be reached. The cassette handling device 61 is provided with a cassette end effector 62, which has dimensions a little smaller than those of a series of cut-outs 56 in the rotary platforms 57. When the cassette handling device 61 has transferred a cassette 40 into the store 38, the end effector 62 of the cassette handling device 61 can be lowered through one of the cut-outs 56 in one of the platforms 57 to place the cassette 40 on the platform 57. Subsequently, the cassette handler 61 can be retracted from the cassette store 38. The cassette handling device 61 is mounted such that it is able to transfer cassettes 40 between the input/output station 63 and the store 38. The device 61 is also capable of transferring cassettes 40 between the store 38 and a rotatable cassette transfer platform 60, or between the input/output station 63 and the rotatable cassette transfer platform 60.

The rotatable cassette transfer platform 60 is constructed such that, on rotation, the cassette 40 is placed against the partition 34 between the cassette transfer section 53 and the wafer handling section 52. The partition 34 is provided with a closure and a closure mechanism, together forming an interface schematically indicated by the reference numeral 67. After placing the cassette against the interface 67 in the partition 34, the closure mechanism grips and unlocks the closure of the cassette and simultaneously opens the closure in the partition 34 and the closure of the cassette.

A wafer handling device 54 within the wafer handling section 52 transfers wafers between the cassette concerned and a wafer support holder 42. The wafer support holder 42 accommodates more wafers than can be held in the cassettes of the preferred embodiments, i.e., more than 25 wafers when using presently standard FOUPs, preferably more than 50 wafers and more preferably greater than 70 wafers. As discussed herein, the wafer handling device 54 preferably comprises a robot end effector 59 configured to handle individual wafers. To load a wafer into the wafer support holder 42, the wafer handling device 54 first transfers a wafer from a cassette 40 to a transfer station, e.g., contained within the cassette 40, and then transfers a wafer support from a storage position, e.g., contained in the wafer support holder 42, to the transfer station. After seating the wafer upon the wafer support, the wafer, situated on the wafer support, is loaded into the wafer support holder 42. Each of the wafer support holders 42 preferably comprises a wafer boat or rack supported on a pedestal. A doorplate is preferably provided below each of the pedestals.

It will be appreciated that where a transfer station is not contained within the FOUP or cassette 40 containing wafers, a separate transfer station (not shown) is provided in the wafer handling section 52. It will also be appreciated that, in another embodiment, both the wafers and the wafer supports are preferably provided to the processing system 30 in FOUPs, with a closure in the interface 67 for each FOUP (not shown). In such an embodiment, two rotatable cassette platforms 60 orient both FOUPs so that they are simultaneously open to the wafer handling section 52.

After loading of wafers into the wafer support holder 42 is completed, a transfer arm 46 preferably moves the wafer support holder 42 upon a support surface 47 through an openable closure 49 in the partition 33 from the wafer handling chamber 52 into the processing chamber 51. The illustrated processing section 51 is provided with a rotary transfer platform 41, supporting a plurality of wafer support holders 42. Two reactors, which in this case comprise furnaces 36, 37, are arranged in the processing chamber 51. The furnaces 36, 37 are positioned vertically and wafer support holders 42, filled with wafer/wafer support combinations 43, are introduced vertically into the furnaces 36, 37 from below. To this end, each furnace 36, 37 has an insertion arm 44, which is movable in the vertical direction. The doorplates below the wafer support holders 42 serve to seal the reactors from the outside processing section when the wafer support holders 42 are lifted up into the reactors.

The processing of a large number of wafers can be carried out as follows: the operator, shown diagrammatically in FIG. 2, loads the store 38 by introducing a number of cassettes 40 on the input/output station 63 and carrying out control operations on a control panel 66. Each of the cassettes 40 is transferred from the input/output station 63 with the aid of the cassette handling device 61 into the storage compartments 39 made for these cassettes in the store 38, specifically on the stacked rotary platforms 57. By rotation of the store 38 and use of the elevator 65, it is possible to fill various compartments with the cassettes 40. After filling the store 38, no further human interaction is required with this exemplary automated installation.

The cassettes 40 concerned are then removed from the store 38 by the cassette handler device 61 and placed on the cassette transfer platform 60. The cassette transfer platform 60 comprises two levels, schematically indicated in FIG. 2, each level capable of receiving a cassette, where the two levels can be rotated independently of one another. Upon rotation of the cassette transfer platform 60, the cassettes are placed against the partition 34. Advantageously, in embodiments where a transfer station is located in a FOUP providing either wafers or wafer supports to the process chamber 51, one platform 60 can accommodate FOUPs for providing wafers while the other platform accommodates FOUPs for providing wafer supports. The FOUPs on both levels may then be simultaneously open to the handling chamber 52. In any case, after opening of the closure of the cassette, together with the closure 67 in the partition 34, the wafers are removed by the wafer handler 54, transported to the transfer station, seated upon a wafer support and the wafer/support combination 43 is placed in a wafer support holder 42. After the wafer support holder 42 has been filled, and becomes available for one of the reactors 36, 37, the closure 49 in partition 33 is opened and the wafer boat or support holder 42 is placed on the transfer platform 41 by the transfer arm 46. The transfer platform 41 then moves the wafer support holder 42 within the process chamber 51 to a position below the reactor to be loaded. Then the insertion mechanism or elevator 44 moves the wafer support holder 42 into the reactor 36 or 37. Treated wafers move counter to the course described above after being lowered and cooled within the process chamber 51.

Figure 4:
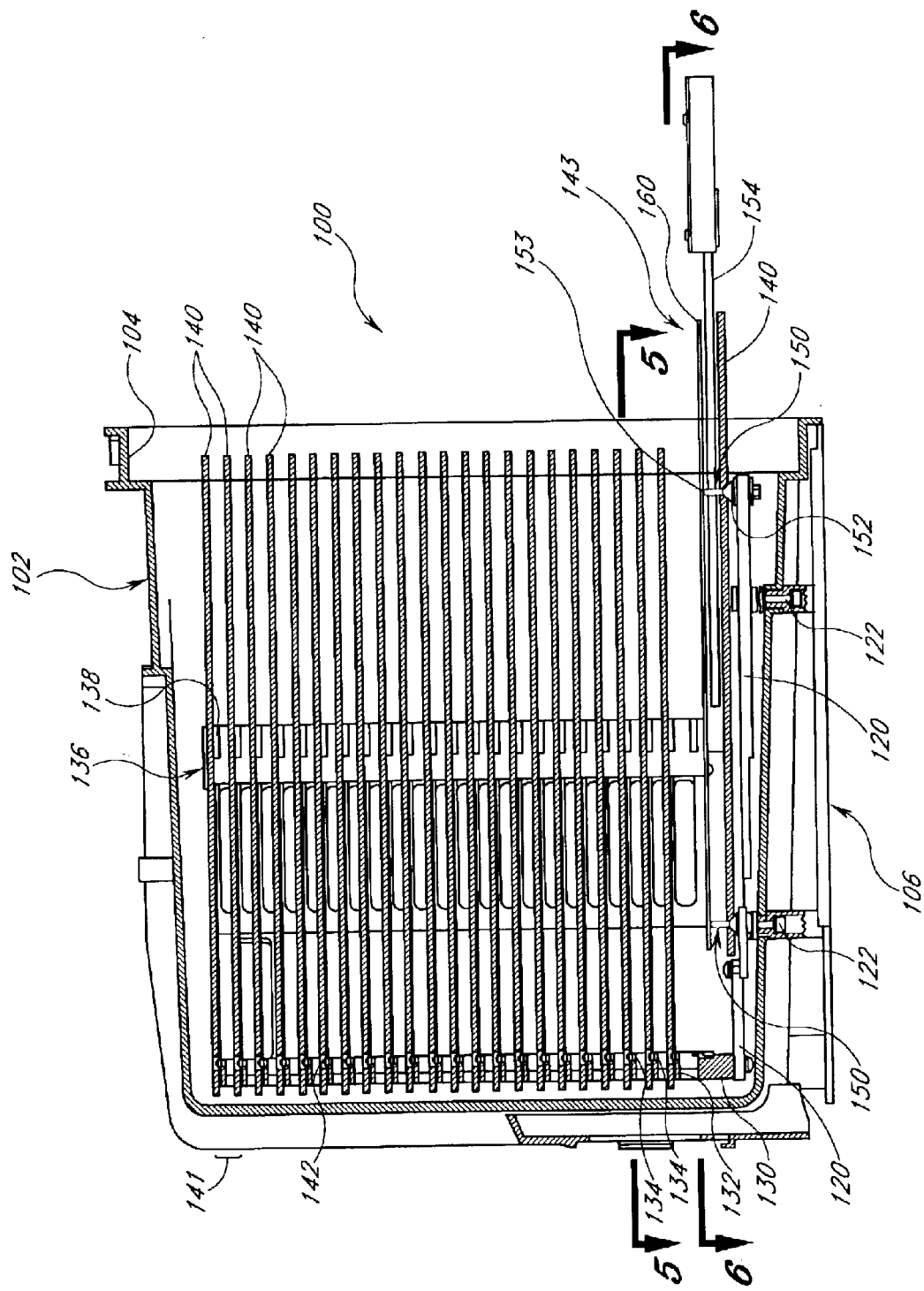
FIG. 4 is a cross-sectional side view of a wafer support storage front opening unified pod (FOUP) comprising a transfer station and constructed in accordance with preferred embodiments of the invention.

As described above, the wafer supports may be supplied to the processing system in cassettes, such as closable FOUPs. With reference now to FIG. 4, a FOUP according to a preferred embodiment of the invention is indicated in its entirety by reference numeral 100. The FOUP 100 comprises a housing 102, which is provided at one end with a flange 104 to receive a door 110 (FIGS. 5A and 5B). At the bottom of the FOUP 100, a mechanical interface 106 is preferably provided for supporting the FOUP 100 on a support table. Preferably, the outer surfaces of the FOUP 100, including the housing 102 and the bottom interface 106, are configured in accordance with SEMI standards.

Inside the housing 102, a support structure 120 is provided. The support structure 120 is mounted at the lower side of the housing with bolts 122.

Attached to the support structure 120 are vertically extending support beams 130 and 136, provided with surfaces 132 and 138 to hold the wafer supports 140. Each surface 132 is provided with a support ridge 134 with sloped sides. The support ridge 134 fits into a hole 142 in the wafer support 140 to provide centering and positioning capabilities for the wafer supports 140. The surfaces 132 and 138, the support ridge 134 and the volume inside the FOUP 100 for accommodating a wafer support 140 together comprise a storage accommodation 141. In total, 23 storage accommodations 141 for wafer supports 140 are illustrated, of which a bottom accommodation 141 is shown empty.

It will be appreciated that an unadapted form of the illustrated FOUP 100 can accommodate 25 wafers 160. As illustrated, however, at the lower end of the FOUP 100, where two additional storage accommodations 141 are ordinarily found in cassettes designed for accommodating 25 wafers 160, a transfer station 143 is preferably provided instead. The transfer station 143 preferably comprises three pins 150, each pin provided with a conical lower end 152 on which a wafer support 140 can be supported and a cylindrical upper part 153, on top of which a wafer 160 can be supported. Preferably, the material of the pins 150 is PEEK™ (poly-ether-ether-ketone) or another material that is not damaging to wafers, such as Teflon™ or polypropylene. To allow passage of the cylindrical upper parts 153 of the pins 150, each wafer support 140 is preferably provided with three holes 142.

In order to place a wafer 160 onto a wafer support 140, the wafer support 140 is transferred to the transfer station 143 from its storage accommodation 141 in the FOUP 100. The storage accommodations 141 have enough height such that a robot end effector 154 can move between adjacent wafer supports 140 without unintentional touching of those supports 140. To transfer a wafer support 140, a robot end effector 154 contacts the wafer support 140 from its bottom, taking the wafer support 140 off the surfaces 132 and 138 and off the support ridge 134. While on the end effector 154, the wafer support 140 is then moved by a robot from its storage accommodation 141 to the transfer station 143, provided at the lower end of the FOUP 100. The robot places the wafer support 140 so that its holes 142 pass over the cylindrical upper parts 153 of the support pins and the wafer support rests on the conical part 152 of the support pins 150.

As discussed above, the position of the wafer supports 140 can be locked in the storage accommodations 141 by the support ridges 134. Advantageously, this locking ensures that the wafer supports 140 are correctly oriented for transport to the transfer station 143, such that the position of the holes 142 in the wafer supports 140 align with the positions of the pins 150 when the wafer supports 140 are moved to the transfer station 143.

After a wafer support 140 is transferred to the transfer station 143, a wafer 160 is also transferred to the transfer station 143 and is placed on top of the pins 150. It will be appreciated that the upper end of pins 150 is high enough so that there is enough space for the end effector 154 to lower out of contact with the wafer 160, then retract and move between the lower surface of a wafer 160 supported on pins 150 and an upper surface of a wafer support 140 supported on the conical part 152 of pins 150 without unintentional touching of the wafer 160 or the wafer support 140.

After lowering the wafer 160 to place it on top of the pins 150, the robot retracts the end effector 154, moves it vertically to a level below the lower surface of wafer support 140 and then extends it again, so that the end effector 154 is now placed below the wafer support 140, which, as discussed above, has been positioned on the conical part 152 of the pins 150. The end effector 154 next moves upward. In doing so the end effector 154 contacts and lifts the wafer support 140, causing the wafer support 140 to contact and lift the wafer 160. By so moving, both the wafer support 140 and the wafer 160 are lifted above the pins 150, with the wafer 160 resting upon the wafer support 140. Then the robot can transport the wafer support 140 together with the wafer 160 to the boat or wafer support holder 42 (FIG. 2), where the wafers 160 are subjected to a semiconductor fabrication process.

Figure 5A:
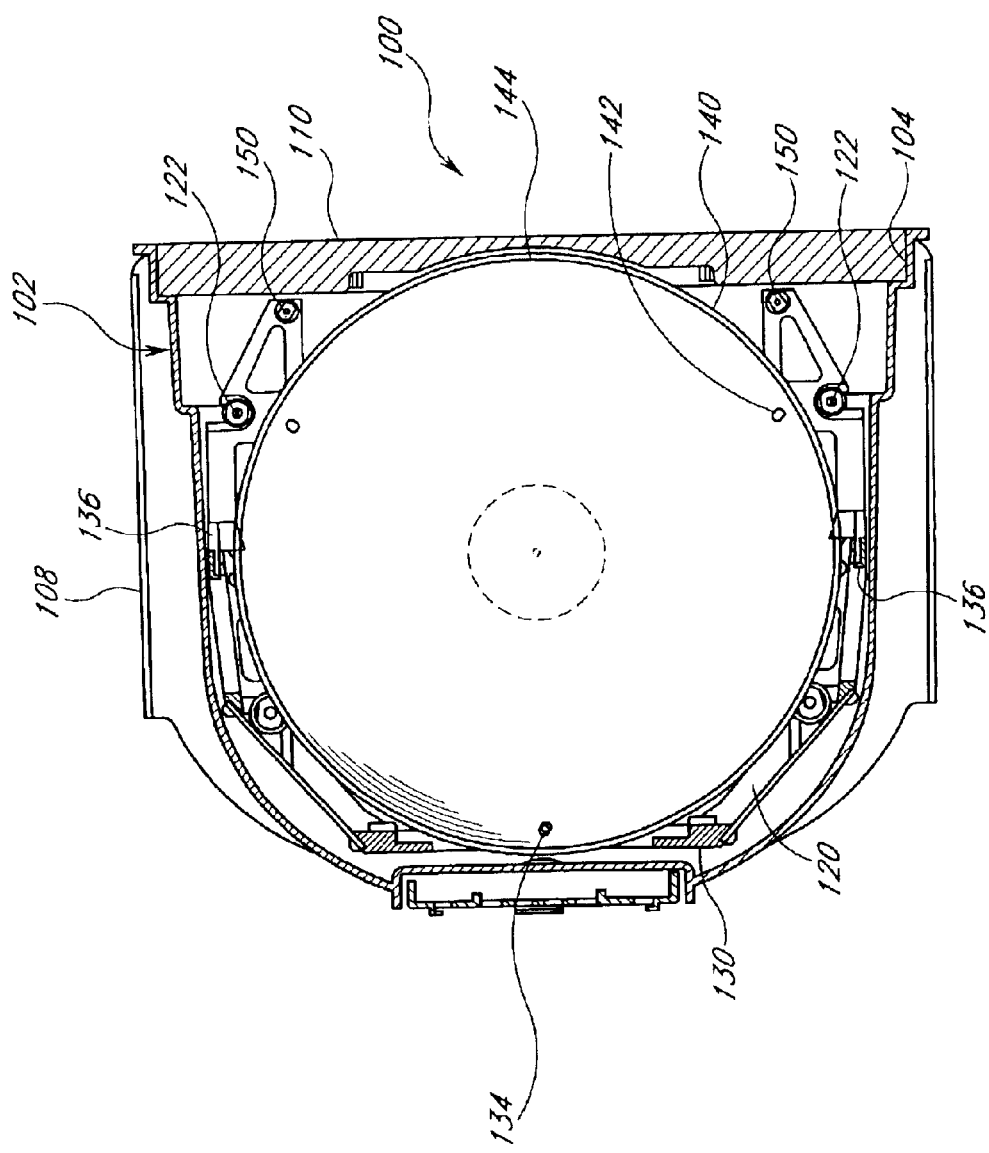
FIG. 5A is a cross-sectional top view of the wafer support storage FOUP of FIG. 4, taken along lines 5—5 of FIG. 4, shown with the FOUP door closed and a wafer support according to one preferred embodiment of the invention.
Figure 5B:
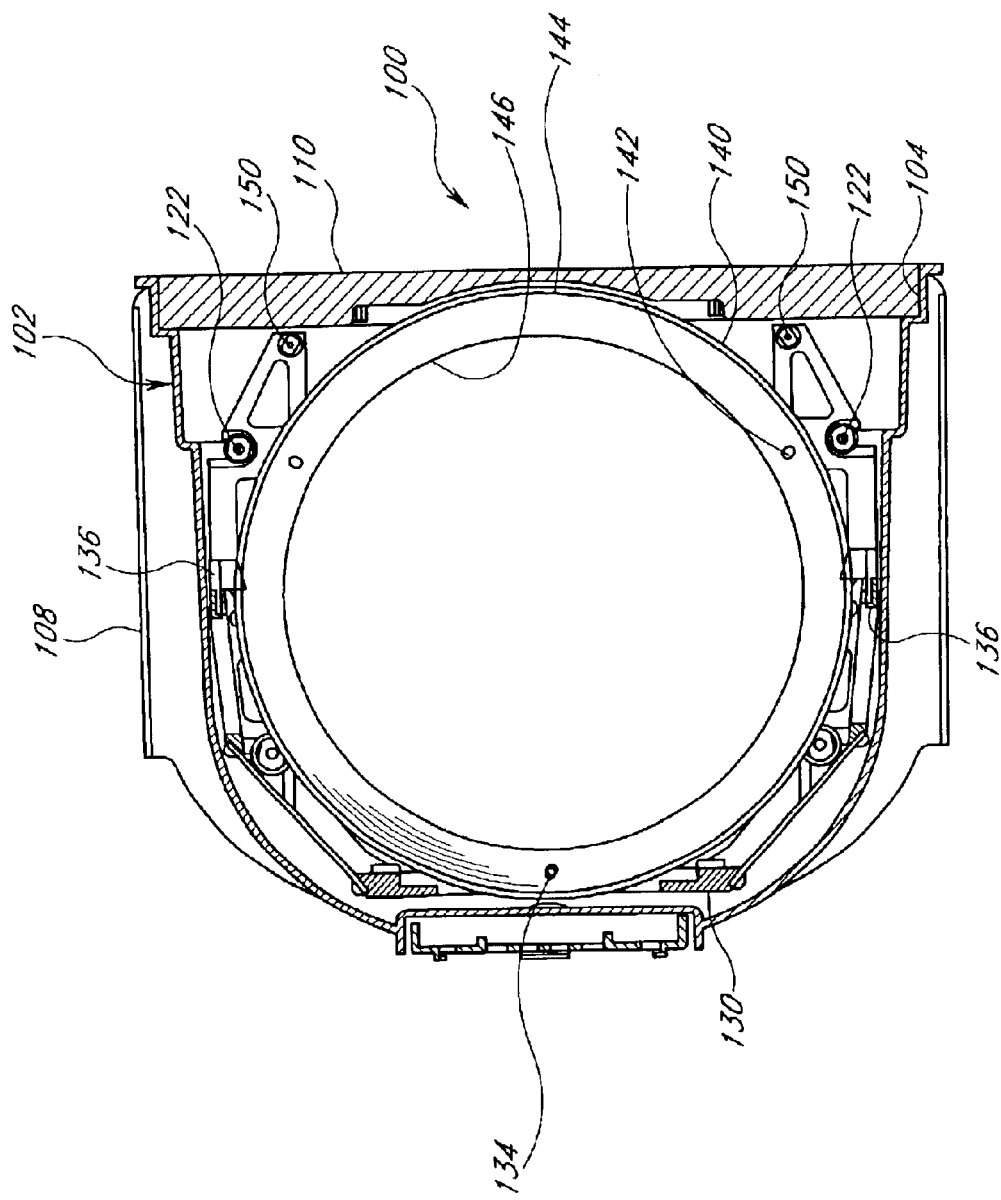
FIG. 5B is a cross-sectional top view of the wafer support storage FOUP of FIG. 4, taken along lines 5—5 of FIG. 4, shown with the FOUP door closed and a wafer support according to another preferred embodiment of the invention.

FIGS. 5A and 5B illustrate cross-sectional top views of the FOUP 100 with door 110 of the FOUP 100 shown in a closed position in each Figure. In FIG. 5A the wafer support 140 is a circular plate and in FIG. 5B the wafer support 140 is a ring having a circular shape and an inner circumference or boundary 146. Notably, in each of FIGS. 5A and 5B, the wafer support 140 is locked in its stored orientation by the support ridge 134, at the side opposite the door 110. In addition, the wafer support 140 preferably has a raised edge 144 that can shield the edge of a wafer 160 (FIG. 9) against excessive heat radiation during processing.

Figure 6A:
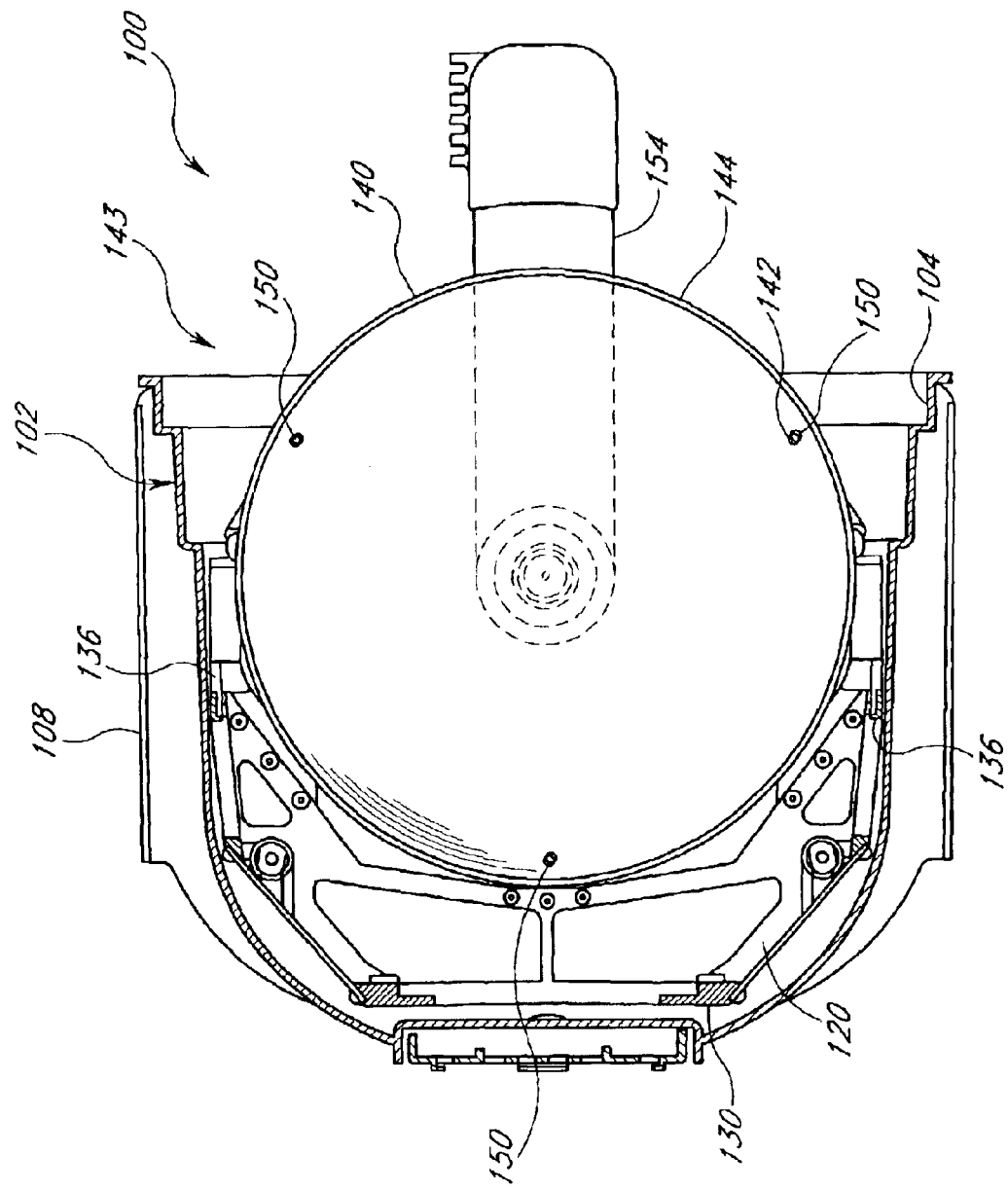
FIG. 6A is a cross-sectional top view of the wafer support storage FOUP of FIG. 4, taken along lines 6—6 of FIG. 4, showing the transfer station holding the wafer support of FIG. 5A.
Figure 6B:
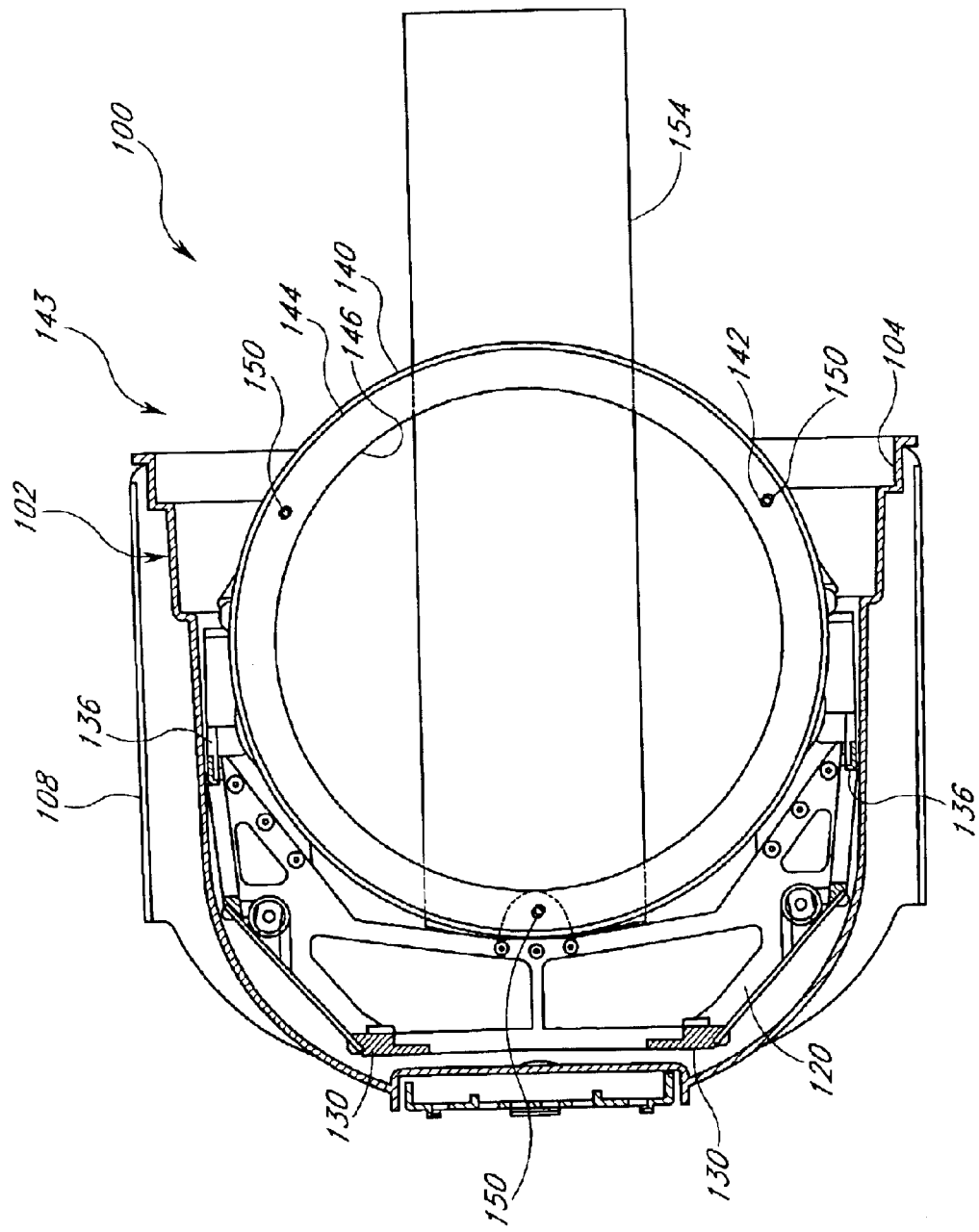
FIG. 6B is a cross-sectional top view of the wafer support storage FOUP of FIG. 4, taken along lines 6—6 of FIG. 4, showing the transfer station holding the wafer support of FIG. 5B.

FIGS. 6A and 6B illustrate cross-sectional top views of the transfer station 143 in the FOUP 100, with the wafer support 140 in FIG. 6A being a circular plate and the wafer support 140 in FIG. 6B being a circular ring. As illustrated in FIG. 6A, the end effector 154 can contact the wafer support 140 and/or a wafer 160 (not shown) at its bottom surface, typically at its center. Such an exemplary end effector is described in U.S. Provisional Application No. 60/377,904, filed May 2, 2002, and corresponding U.S. Application No. 10/361,480 entitled TWO LEVEL END EFFECTOR, filed Feb. 5, 2003 by den Hartog, the disclosures of which are incorporated herein by reference. In FIG. 6B, the end effector 154 extends across the diameter of the ring to contact opposite sides of the wafer support 140 and/or wafer 160 (not shown) and can be, e.g., an edge support end effector (see FIGS. 6B and 7). Such an exemplary edge support end effector is also described in U.S. Provisional Application No. 60/377,904 and U.S. Utility Application No. 10/361,480, entitled TWO LEVEL END EFFECTOR, filed Feb. 5, 2003 by den Hartog. It will be appreciated that edge support end effectors are suitable for use with the wafer support 140 whether the wafer support 140 is a plate or a ring.

In each of FIGS. 6A and 6B, the wafer support 140 rests on the pins 150 and the end effector 154 is present below the wafer support 140. A mechanical side interface of the FOUP 100 is indicated with reference numeral 108. While resting on the pins 150 at the transfer station 143, the wafer support 140 is preferably displaced outwardly relative to wafer supports 140 housed in the storage accommodations 141. In this way, the wafer support 140 is sufficiently clear from the support beams 136 such that the wafer support 140 can be vertically moved to an extent sufficient for loading and unloading of the wafer support 140 and the wafer 160.

Figure 7:
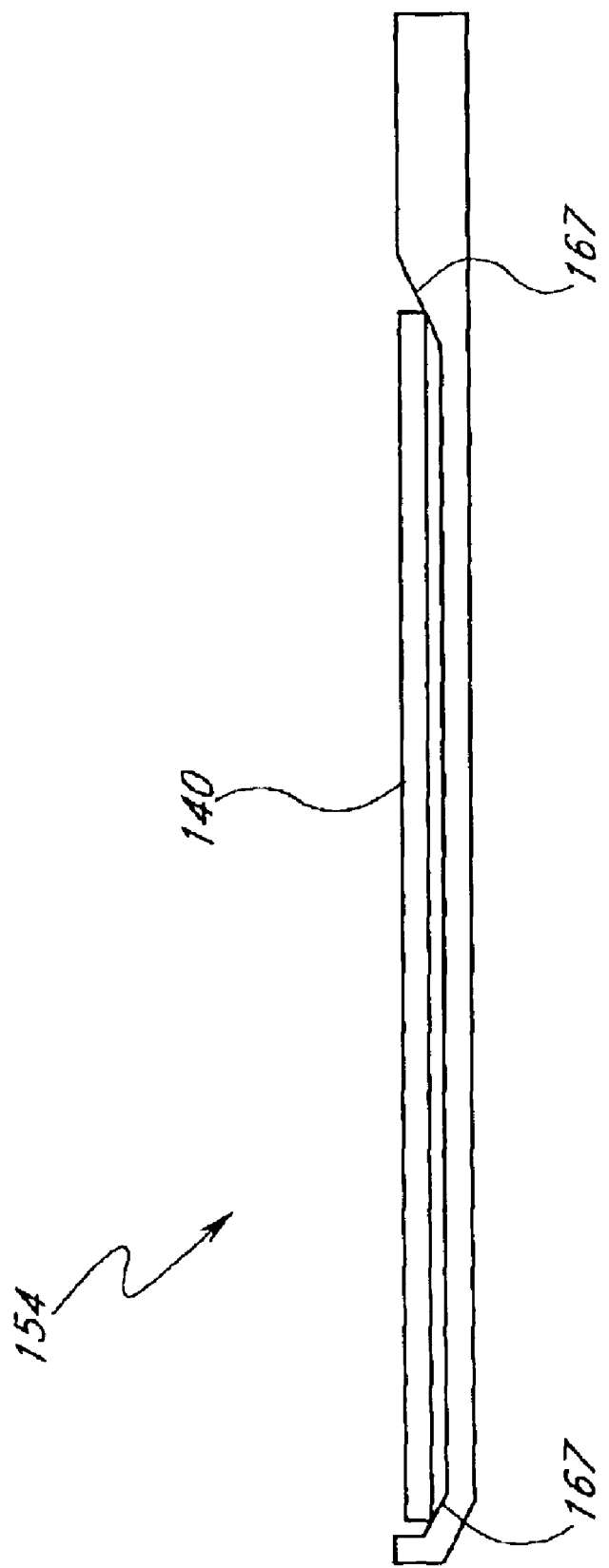
FIG. 7 is a cross section of an exemplary edge support end effector for use with preferred embodiments of the invention.
Figure 8:
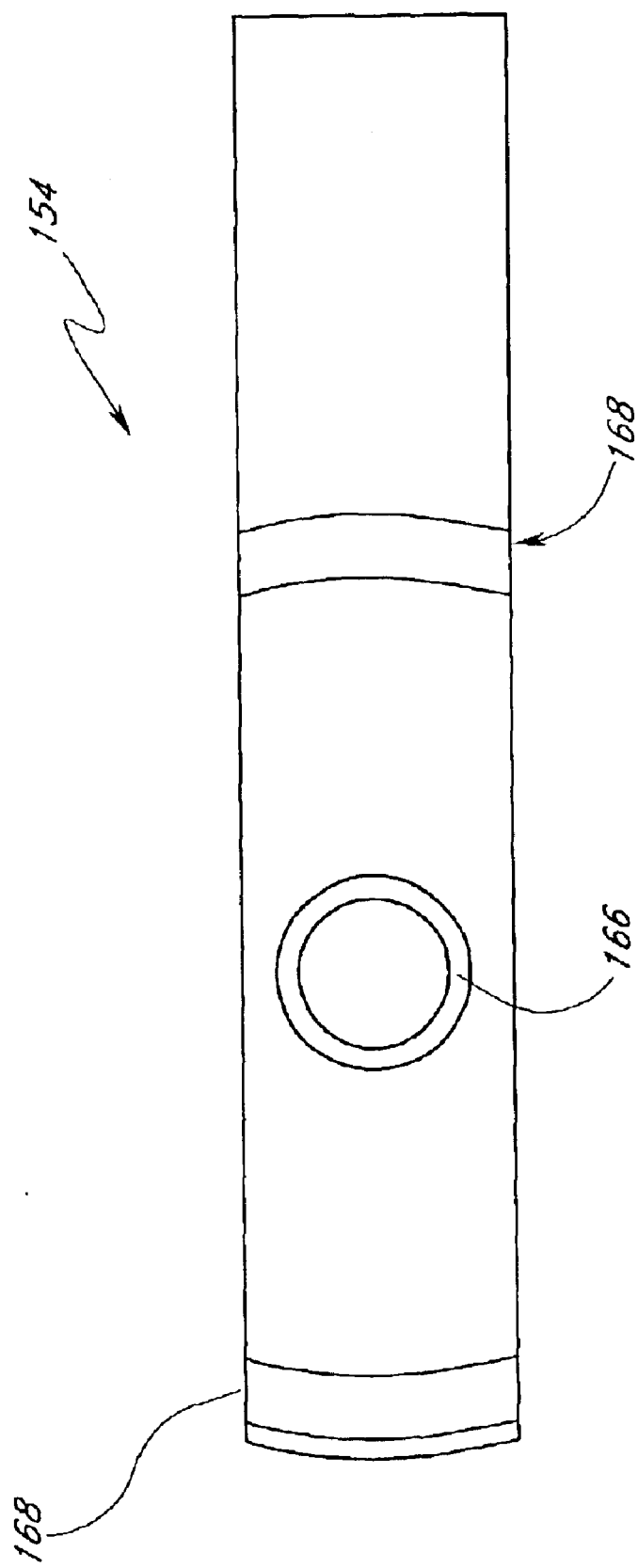
FIG. 8 is a top view of an exemplary contact end effector for use with preferred embodiments of the invention.

A particularly simple edge support end effector for transporting wafer supports and/or wafers is illustrated in FIG. 7. The illustrated end effector 154 is provided with sloped contact surfaces 167 that contact and support wafer support 140 or a wafer (not shown) at their edges.

Where the wafer support 140 is a ring, as an alternative to an end effector 154 that contacts the wafer 160 and/or the wafer support 140 along the edge of the wafer support 140, in another embodiment, an end effector 154 can be used that contacts the wafer 160 at its bottom surface, typically in a central region of the wafer 160. In this embodiment, the length of the end effector 154 is preferably long enough such that an annular wafer support 140 is supported at two opposing parts of the ring. An example of such an end effector is shown in FIG. 8. The contact surface supporting the wafer 160 is indicated by reference numeral 166 and the contact surface supporting the annular wafer support is indicated by reference numeral 168. Preferably, the contacting surfaces 168 have a large enough radius to accommodate wafer 160 (not shown) without contacting the wafer 160 while the wafer 160 is supported upon the surface 166.

Figure 9A:
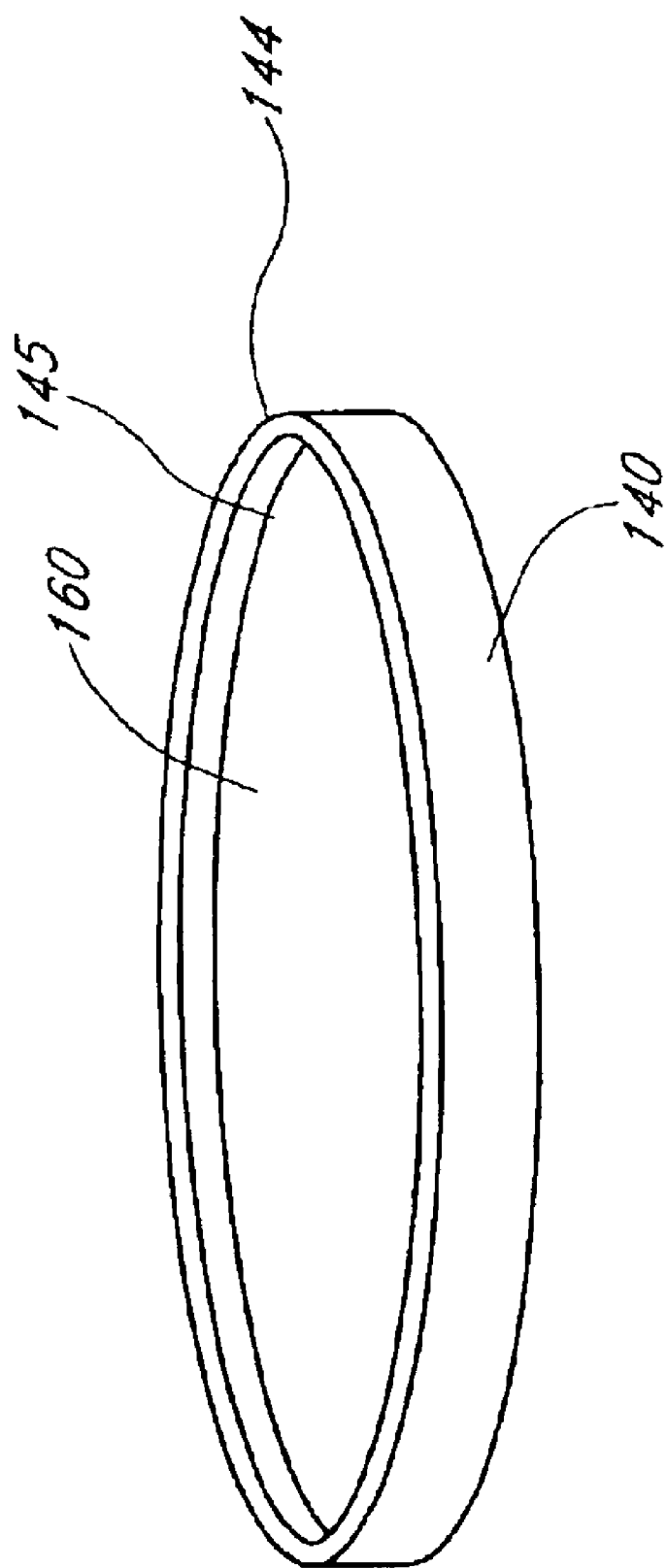
FIG. 9A is a perspective view of a wafer supported on a wafer support in accordance with preferred embodiments of the invention.

FIGS. 9A and 9B show, in isolation, perspective and cross-sectional views, respectively, of the wafer 160 supported on the wafer support 140 in one preferred embodiment of the invention. It will be appreciated that the figures are not necessarily drawn to scale, such that, for example, the relative thicknesses of the wafer 160 and the wafer support 140 and the size of the gap between the wafer 160 and the wafer support 140 may differ from that illustrated. Nevertheless, as illustrated, the wafer support 140 preferably has a raised shoulder or edge 144 that can shield the edge 145 of a wafer 160 against receiving excessive heat radiation during heat up, preventing overheating of the edge 145. Furtherrmore, by surrounding the wafer 160, the raised edge 144 advantageously minimizes horizontal movement of the wafer 160 during transport of the wafer support 140 with the wafer 160 thereon.

It will be appreciated that although the transfer station 143 is preferably provided at the lower end of a FOUP, in other embodiments it can be placed at an upper end of the FOUP or at a selected point between the upper and lower ends of the FOUP. In yet other embodiments, the transfer station 143 can be placed at another position in the treatment system, e.g., at a fixed position and not in a FOUP. For example, FIGS. 10A–10C illustrate schematically the above-described configuration for the FOUP 100, along with two exemplary alternative configurations.

Figure 10A:
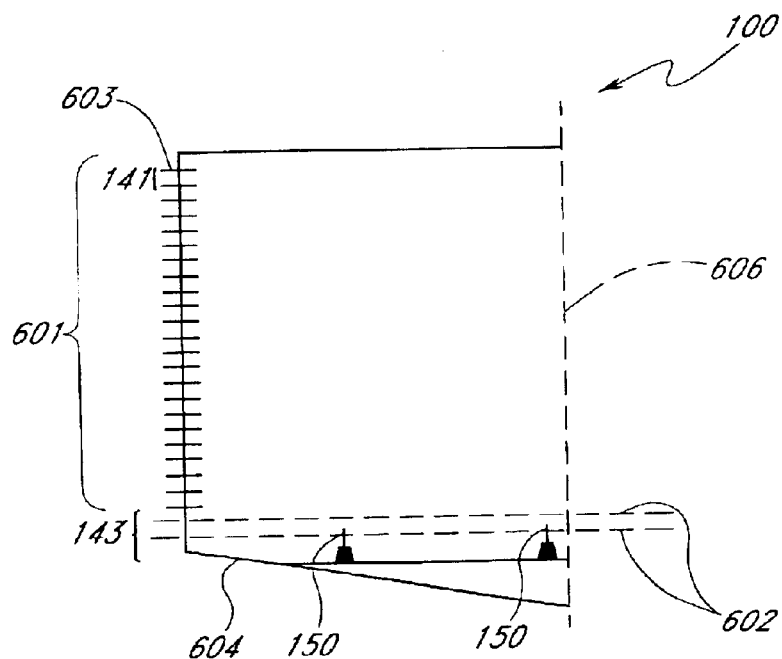
FIG. 10A is a schematic illustration showing an exemplary configuration for a FOUP in accordance with preferred embodiments of the invention.

FIG. 10A illustrates the configuration described above with respect to FIGS. 4–6. Reference numeral 601 indicates all storage accommodations 141 for wafer supports and/or wafers in the FOUP 100. A total of 23 stripes 603 are indicated, the space directly above each stripe 603 representing one of 23 storage accommodations 141. Reference numeral 143 indicates the transfer station. The two lines 602 indicate the space above support pins 150 that is required for robotic transfer of wafer support 140 and wafer 160. To maximize the number of storage accommodations 141, the pins 150 of the transfer station 143 at the bottom of the FOUP 100 are shifted slightly outwardly, so that the transfer station 143 can be shifted downwardly along the lower wall 604 while still being able to accommodate wafer supports 140 and wafers 160 on the pins 150 (FIGS. 6A and 6B). Thus, relative to the pins 150 being coaxially aligned with the holes 142 of the wafer supports 140 as those supports 140 are seated in the storage accommodations 141 (FIG. 4), the pins 150 in this configuration are shifted outwardly in the direction of the opening 606 of the FOUP 100. In such a configuration, a wafer support 160 resting on the pins 150 at the transfer station 143 sticks out of the FOUP 100 (FIG. 4).

Figure 10B:
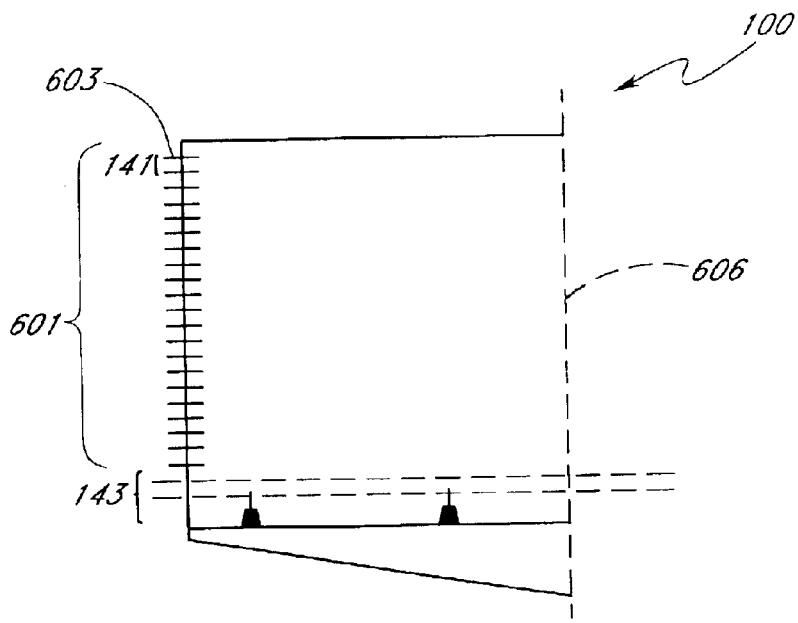
FIG. 10B is a schematic illustration showing another exemplary configuration for a FOUP in accordance with preferred embodiments of the invention.

In FIG. 10B, the number of wafer support accommodations 141 is reduced to 21, with the space directly above each stripe 603 representing one of the 21 storage accommodations 141. By reducing the number of storage accommodations 141, the transfer station 143 can be shifted inward relative to the arrangement illustrated in FIG. 10A and, so, can be positioned coaxially aligned with the storage accommodations 141. In this arrangement, when a wafer support 140 is placed at the transfer station 143, the door (not shown) of the FOUP 100 can be closed.

Figure 10C:
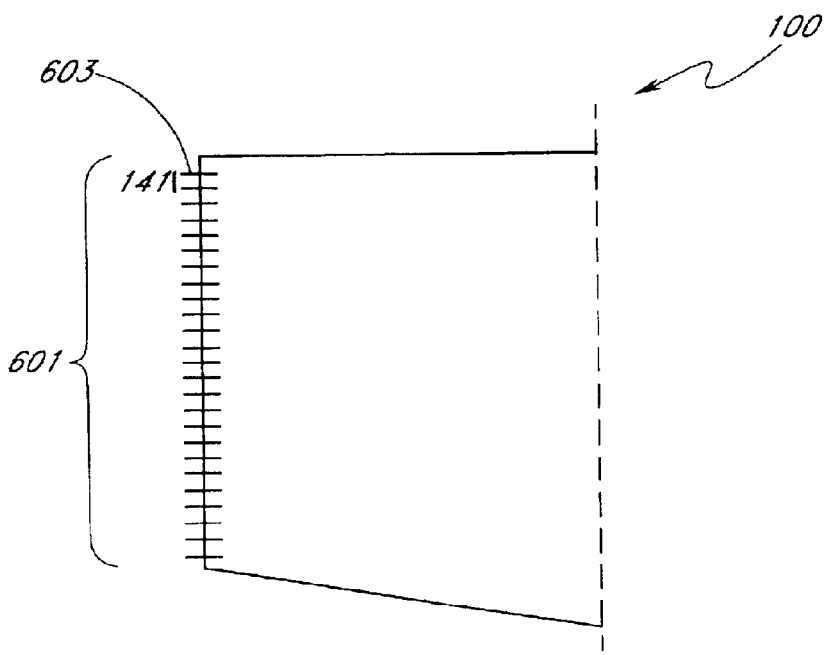
FIG. 10C is a schematic illustration showing yet another exemplary configuration for a FOUP in accordance with preferred embodiments of the invention.
Figure 10C:
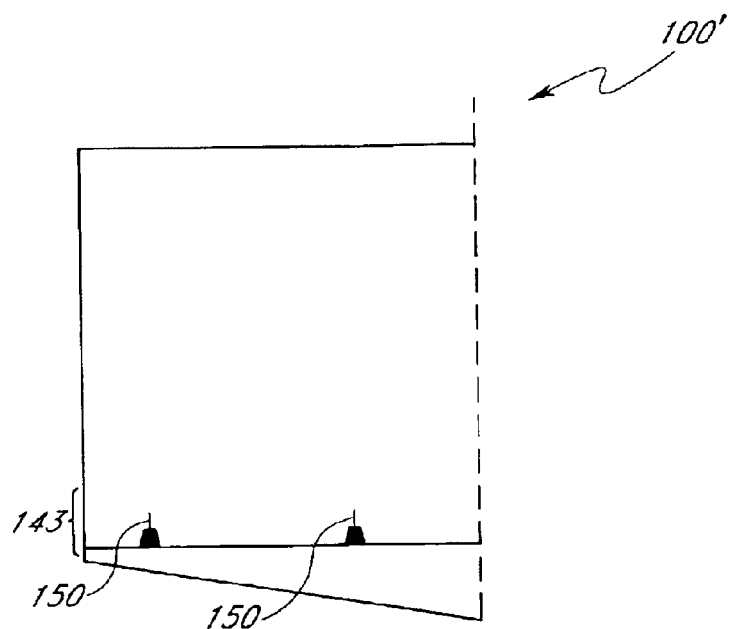

In FIG. 10C, the storage function and the transfer function are completely separated. Storage accommodations 141 are contained in one FOUP 100, while the transfer station 143 is formed in a separate station 100' completely separate from the FOUP 100.

It will be appreciated that the total number of storage accommodations 141 that fit into the interior space of a FOUP containing a transfer station 143 is only limited by available space and the ancillary transfer station equipment. In the configurations illustrated in FIGS. 10A–10C, this number can range from 0 (the configuration station 100' of FIG. 10C) to about 23 (the configuration of FOUP 100 of FIG. 10A). The FOUP can fit more or fewer storage accommodations 141, however, if the interior space of the FOUP is increased or decreased, e.g., if the height of the FOUP is increased or decreased. Consequently, it will be appreciated that while the illustrated FOUPs provide a particular number of accommodations 141 for wafer supports 140, the total number of wafers 160 and wafer supports 140 to be loaded in a cassette formed in accordance with the teachings herein are not limited by the present teachings and can be varied. In other embodiments, the number of wafers 160 and wafer supports 140 can be 25 or 50 or any number that can be accommodated by the processing system. Moreover, in other embodiments, the wafer supports 140 can be provided in more than one FOUP, if necessary.

It will also be appreciated that while the same holes 142 (FIG. 4) are illustrated as both allowing support pins 150 to pass through them to support the wafer 160 in the transfer station 143 and to lock the wafer supports 140 upon the surfaces 132 (typically by way of the support ridges 134) in the storage accommodations 141, separate holes and/or grooves can be provided for each of these functions, at each of these locations. Moreover, in other embodiments, different sets of support structures in the transfer station 143 can be used to support the wafer support 140 and the wafer 160, respectively. For example, the pins 150 can be used to solely support the wafer 160, while the wafer support 140 can be supported by other support structures, e.g., a set of pins separate from the pins 150.

Moreover, it is not necessary to provide the wafer supports 140 with holes such as the holes 142. For example, in another embodiment, the wafer support 140 can be supported on its lower surface and the wafer 160 can be supported on elevated structures, such as pins, in the central, open area of an annular wafer support 140 (see, e.g., FIG. 6B), so long as the movement of the end effector 154 is not obstructed. In such a case, the wafer supports 140 need not be provided with holes 142.

Preferably, the wafer supports 140 are formed of quartz. In another preferred embodiment, for use in conjunction with wafer processing at high temperatures, the wafer supports 140 are preferably formed of a material with high temperature resistance and that is available in high purity. Silicon carbide (SiC) is an example of such a material. For very high temperature processing, the preferred SiC material for the wafer supports is so-called "free-standing" CVD SiC. This is a SiC coating, initially deposited on a support material but with a thickness that is sufficient to allow removal of the support material. As known in the art, the support material can be, e.g., graphite. An exemplary method of forming a structure with "free-standing" CVD SiC is disclosed in U.S. Pat. No. 4,978,567, issued Dec. 18, 1990 to Miller, the disclosure of which is incorporated herein by reference.

Advantageously, as discussed above, in preferred embodiments, the wafers 160 and the wafer supports 140 can be stored in cassettes, such as the FOUP 100, that can be used with a standard furnace. As such, a standard furnace, provided with a standard wafer-handling robot, can easily be adapted for processing in conjunction with these preferred embodiments, without the need for significant changes in hardware. Moreover, advantageously, providing the wafer supports 140 in a special FOUP 100, which simultaneously houses the transfer station 143, is particularly efficient as it minimizes the movements of the wafer supports 140 during loading and unloading. In addition, the use of the FOUP 100 for storage and transport of the wafer supports 140 allows easy access to other equipment provided with FOUP interfaces, such as cleaning equipment.

Furthermore, making the wafer supports 140 removable, to be placed in a standard design, slotted cassette, keeps the wafer supports 140 simple in shape and easy to manufacture.

It will be appreciated by those skilled in the art that various omissions, additions and modifications may be made to the processes and apparatus described above without departing from the scope of the invention. For example, aspects of the transfer station described herein can be provided in an open cassette or can be provided in a separate station not associated with a cassette. Moreover, in different arrangements, the mechanism for separating a wafer from a wafer support during unloading, or for joining the wafer to the wafer support during loading, can take on different configurations, e.g., using different sets or orientations of pins, different end effectors, etc. All such modifications and changes are intended to fall within the scope of the invention, as defined by the appended claims.

We claim:

1. A method for semiconductor processing, comprising:
   receiving a wafer and a wafer support at a transfer station;
   seating the wafer onto the wafer support at the transfer stations, wherein the wafer support supports an entire perimeter of the wafer when the wafer is seated on the wafer support;
   transporting the wafer support away from the transfer station into a process chamber, wherein the wafer is seated upon the wafer support during transporting; and
   subjecting the wafer to a semiconductor fabrication process in the process chamber, wherein the wafer is seated on the wafer support during the semiconductor fabrication process.

2. The method of claim 1, wherein the process chamber comprises a furnace.

3. The method of claim 1, wherein transporting the wafer support into a process chamber comprises loading the wafer and wafer support together into a wafer support holder.

4. The method of claim 3, wherein transporting the wafer support further comprises placing the wafer support holder into the process chamber after loading the wafer and wafer support together into the wafer support holder.

5. The method of claim 3, wherein the wafer support holder is a wafer boat holding more than 25 wafers.

6. The method of claim 1, wherein seating a wafer onto the wafer support comprises passing a plurality of support pins through a plurality of holes in the wafer support.

7. The method of claim 6, wherein passing comprises lowering the wafer support without moving the plurality of support pins.

8. The method of claim 6, wherein seating the wafer onto the wafer support further comprises placing the wafer on the plurality of support pins.

9. The method of claim 8, wherein seating the wafer onto the wafer support further comprises lifting the wafer support to contact the wafer, wherein lifting comprises elevating the wafer support and the wafer above the plurality of support pins.

10. The method of claim 9, wherein lifting the wafer support to contact the wafer and placing the wafer onto the wafer support comprises employing a single robot end effector.

11. The method of claim 9, further comprising, after subjecting the wafer to the semiconductor fabrication process, unloading the wafer from the wafer support by lowering the wafer support away from the wafer.

12. The method of claim 11, wherein the wafer is supported by the plurality of wafer support pins during unloading.

13. The method of claim 1, wherein seating the wafer onto the wafer support is conducted within a cassette, the cassette have a plurality of storage slots.

14. The method of claim 1, wherein a shape of the wafer support from a top view is a ring.

15. The method of claim 1, wherein the wafer support comprises a plate.

16. The method of claim 15, wherein the wafer support comprises a plurality of through holes and a raised annular ring, the ring forming a wall that surrounds the wafer when the wafer is seated upon the wafer support.

17. The method of claim 1, wherein subjecting comprises heating the wafer to greater than about 1000° C.

18. The method of claim 17, wherein subjecting comprises heating the wafer to greater than about 1300° C.

19. A method for semiconductor processing, comprising:
    placing a wafer on a removable ring-shaped or disk-shaped wafer support;
    subsequently transporting the wafer support, while the wafer is seated upon the wafer support, into a wafer boat, the wafer boat comprising one or more accommodations for wafer supports; and
    subjecting the wafer to a semiconductor fabrication process while the wafer is seated upon the wafer support in the wafer boat.

20. The method of claim 19, wherein subjecting the wafer to a semiconductor process comprises loading the wafer boat into a process chamber after transporting the wafer and wafer support into the wafer boat.

21. The method of claim 19, wherein placing the wafer on the wafer support comprises positioning the wafer support at a first level in a transfer station and positioning the wafer at a second level in the transfer station, the second level above the first level.

22. The method of claim 21, wherein placing the wafer on the wafer support comprises lifting the wafer support to contact the wafer.

23. The method of claim 22, wherein a plurality of support pins pass through a plurality of holes in the wafer support and support the wafer at the second level.

24. The method of claim 21, further comprising unloading the wafer from the wafer support in the transfer station after subjecting the wafer to the semiconductor fabrication process.

25. The method of claim 24, wherein unloading comprises moving the wafer support to the first level and moving the wafer to the second level.

26. The method of claim 21, wherein positioning the wafer support at a first level, positioning the wafer at a second level, placing the wafer on the wafer support and unloading the wafer are performed using a single robot end effector.

27. The method of claim 21, wherein the transfer station is in a cassette.

28. The method of claim 27, wherein the cassette comprises a closeable door.

29. The method of claim 27, wherein exterior surfaces of the cassette conform to a SEMI standard for a front-opening unified pod.

30. The method of claim 27, wherein the cassette comprises a plurality of wafer support receiving slots, each slot comprising a protrusion, the protrusion locking a wafer support occupying the slot by extending into a hole in the wafer support.

31. A system for processing a substrate, comprising:
    a plurality of substrate supports for supporting a plurality of substrates, wherein a substrate support supports an entire perimeter of a substrate;
    a substrate support holder configured to hold the plurality of substrate supports, wherein the plurality of substrate supports are removable from the substrate support holder while a substrate is seated upon the substrate support;
    a reactor configured to accommodate the substrate support holder during substrate processing; and
    a substrate loading station separate from the substrate support holder, the substrate loading station configured to load a substrate onto a substrate support.

32. The system of claim 31, further comprising a robot provided with an end effector configured for transferring a substrate support with a substrate seated on it from the substrate loading station to the substrate support holder.

33. The system of claim 31, wherein the substrate support is a plate capable of supporting an entire bottom surface of a wafer.

34. The system of claim 31, wherein a shape of the substrate support from a top view is a ring.

35. The system of claim 31, wherein the substrate supports comprise quartz.

36. The system of claim 31, wherein the substrate supports comprise silicon carbide.

37. The system of claim 31, wherein a front opening unified pod houses the substrate loading station.

38. The system of claim 37, further comprising a front opening unified pod for providing substrate supports to the substrate support holder.

39. The system of claim 31, wherein the reactor is a batch processing furnace.

40. The system of claim 31, wherein the substrate holder is a wafer boat supporting more than 25 wafer supports.

41. A semiconductor wafer cassette, wherein interior of the wafer cassette comprises:

a wafer loading station, the wafer loading station configured for receiving a wafer and a disk-shaped or ring-shaped wafer support and for loading the wafer onto the wafer support.

42. The cassette of claim 41, wherein the interior of the cassette comprises a plurality of wafer support storage slots, wherein each slot comprises a plurality of laterally extending surfaces for supporting a wafer support.

43. The cassette of claim 42, wherein each slot further comprises a protrusion, the protrusion extending vertically from and having sides sloping down to one of the plurality of laterally extending surfaces.

44. The cassette of claim 43, wherein the protrusion extends into a hole in the wafer support and orients a plurality of holes in the wafer support for alignment with a plurality of support pins in the wafer loading station without rotation of the wafer support.

45. The cassette of claim 43, wherein the plurality of slots numbers 23.

46. The cassette of claim 45, wherein the wafer loading station is located underneath the plurality of slots.

47. The cassette of claim 42, wherein the wafer support is sized and shaped to support a wafer.

48. The cassette of claim 47, wherein the wafer has diameter of 300 mm.

49. The cassette of claim 41, wherein the wafer loading station comprises a plurality of support pins configured to extend through a plurality of holes in the wafer support.

50. The cassette of claim 49, wherein each of the plurality of support pins includes a downwardly flared base, wherein the base narrows into an upper extension.

51. The cassette of claim 50, wherein the flared base has a conical shape.

52. The cassette of claim 50, wherein the plurality of holes in the wafer support are sized and positioned to allow passage of the plurality of support pins through the wafer support, wherein the wafer support rests upon a plurality of flare bases while the upper extensions extend through the holes and above the wafer support.

53. The cassette of claim 52, wherein the upper extension of each of the plurality of support pins has a height sufficient to allow an end effector to extend between the wafer support resting on the plurality of flared bases and a wafer resting on the plurality of upper extensions, wherein the end effector extends without touching either the wafer support or the wafer.

54. The cassette of claim 41, wherein exterior surfaces of the cassette conform to a SEMI standard for a front-opening unified pod.

55. The cassette of claim 41, wherein the wafer loading station is configured to receive the wafer support at a first level and to receive the wafer at a second level, the second level above the first level.

56. The cassette of claim 55, wherein the wafer loading station is configured to directly support the wafer at the second level while maintaining the wafer vertically separated from the wafer support.

* * * * *

UNITED STATES PATENT AND TRADEMARK OFFICE
CERTIFICATE OF CORRECTION

PATENT NO.      : 6,835,039 B2
DATED           : December 28, 2004
INVENTOR(S)     : Jannes Remco van den Berg and Edwin den Hartog It is certified that error appears in the above-identified patent and that said Letters Patent is hereby corrected as shown below:

Column 13,
Line 8, delete "stations," and insert -- station, --.

Column 15,
Line 19, after "wherein" insert -- an --.

Column 16,
Line 6, before "diameter" insert -- a --.
Line 18, delete "flare" and insert -- flared --.

Signed and Sealed this

Thirty-first Day of January, 2006

JON W. DUDAS
*Director of the United States Patent and Trademark Office*